(12) United States Patent
Nakayama et al.

(10) Patent No.: US 8,428,927 B2
(45) Date of Patent: Apr. 23, 2013

(54) SIMULATION METHOD AND SIMULATION APPARATUS

(75) Inventors: Noriyasu Nakayama, Kawasaki (JP); Nobukazu Koizumi, Kawasaki (JP); Tomoki Kato, Kawasaki (JP); Naoki Yuzawa, Kawasaki (JP); Hiroyuki Hieda, Kawasaki (JP); Satoshi Hiramoto, Oyama (JP)

(73) Assignee: Fujitsu Limited, Kawasaki (JP)

( * ) Notice: Subject to any disclaimer, the term of this patent is extended or adjusted under 35 U.S.C. 154(b) by 205 days.

(21) Appl. No.: 12/662,367

(22) Filed: Apr. 13, 2010

(65) Prior Publication Data
US 2010/0204975 A1 Aug. 12, 2010

Related U.S. Application Data

(63) Continuation of application No. PCT/CT2007/070071, filed on Oct. 15, 2007.

(51) Int. Cl.
*G06F 17/50* (2006.01)
(52) U.S. Cl.
USPC .......................................................... 703/13
(58) Field of Classification Search .................. 703/13, 703/14, 20, 21
See application file for complete search history.

(56) References Cited

U.S. PATENT DOCUMENTS

| | | | |
|---|---|---|---|
| 6,038,391 A | | 3/2000 | Kawaba |
| 7,412,369 B1 * | | 8/2008 | Gupta ............................. 703/14 |
| 8,032,875 B2 * | | 10/2011 | Kosche et al. ................. 717/158 |
| 2006/0174155 A1 * | | 8/2006 | Mansell ........................... 714/5 |

FOREIGN PATENT DOCUMENTS

| | | |
|---|---|---|
| JP | 5-158740 | 6/1993 |
| JP | 11-96130 | 4/1999 |
| JP | 2001-249829 | 9/2001 |
| JP | 2003-15914 | 1/2003 |
| JP | 2004-13227 | 1/2004 |
| JP | 2006-23852 | 1/2006 |

OTHER PUBLICATIONS

International Search Report for PCT/JP2007/070071, mailed on Nov. 20, 2007.
Japanese Office Action issued Apr. 30, 2010 in corresponding Japanese Patent Application 2009-537783.

* cited by examiner

*Primary Examiner* — Thai Phan
*Assistant Examiner* — Herng-Der Day
(74) *Attorney, Agent, or Firm* — Staas & Halsey LLP

(57) ABSTRACT

A simulation method includes obtaining an execution log generated while a predetermined processing is executed by simulating a series of operations in a test model that is a modeled version of a test target device by causing a predetermined processing to be executed in the test model, extracting a processing unit log constituted by a predetermined processing unit from the execution log obtained in the obtaining, and simulating an operation in which processing corresponding to the processing unit log extracted in the extracting is executed in a test model in which a part of function of the test target device is modified, the operation being simulated on the basis of a setting condition set by a user.

5 Claims, 13 Drawing Sheets

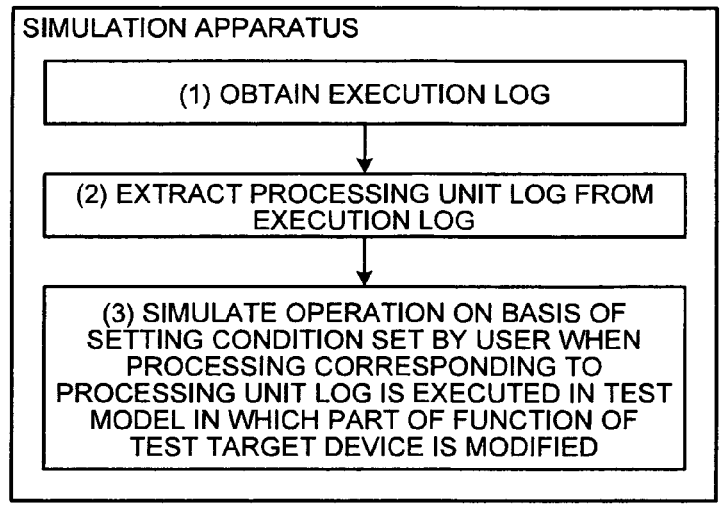
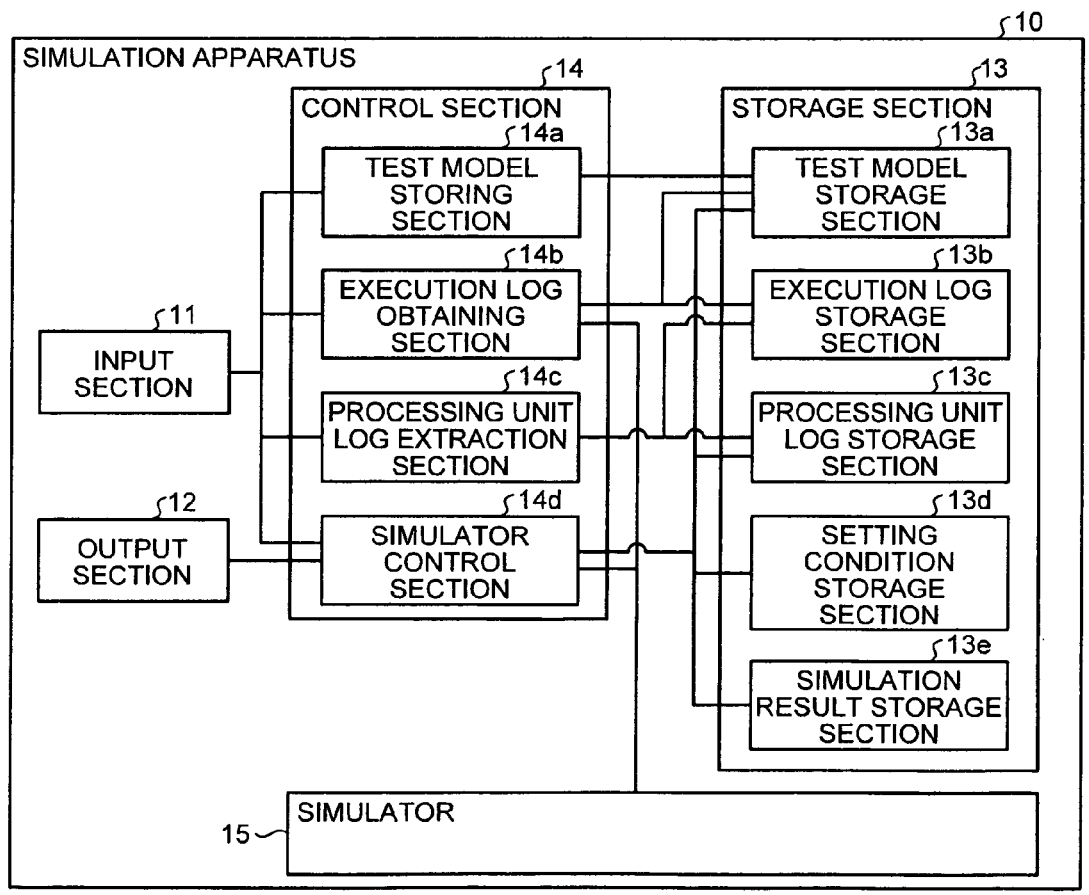

FIG.5

| PROCESSING UNIT LOG | | | | |
|---|---|---|---|---|
| EVENT | 1 | 2 | 3 | |
| | B | L | X | ... |
| | C | M | Y | |
| | | | Z | |

FIG.6

| SETTING CONDITION | |
|---|---|
| EVENT | CYCLE |
| 1 | 1 SECOND |
| 2 | 2 SECONDS |
| 3 | 3 SECONDS |

FIG.7

| SIMULATION RESULT | |
|---|---|
| CPU LOAD RATE | 20% |
| BUS OCCUPANCY RATE | 10% |
| PROCESSING TIME | 1 MINUTE |
| POWER CONSUMPTION | 60 W |
| MEMORY USAGE RATE | 70% |

FIG.10

| EXECUTION LOG | |
|---|---|
| LOG | LABEL |
| A | COMMAND |
| B | COMMAND |
| C | READING DATA |
| D | WRITING DATA |
| B | COMMAND |
| C | READING DATA |
| E | WRITING DATA |
| B | COMMAND |
| C | READING DATA |
| G | COMMAND |
| ⋮ | ⋮ |

FIG.11

| PROCESSING UNIT LOG | | | | | | |
|---|---|---|---|---|---|---|
| EVENT | 1 | | 2 | | 3 | |
| | LOG | LABEL | LOG | LABEL | LOG | LABEL |
| | B | COMMAND | L | COMMAND | X | COMMAND |
| | C | READING DATA | M | WRITING DATA | Y | READING DATA |
| | | | | | Z | COMMAND |
| ⋮ | | | | | | |

FIG.16

| PROCESSING UNIT LOG | | | | |
|---|---|---|---|---|
| EVENT | 1 | 2 | 3 | ... |
| START LOG | B | L | X | |
| THE NUMBER OF LOGS | 4 | 5 | 3 | |

SIMULATION METHOD AND SIMULATION APPARATUS

CROSS-REFERENCE TO RELATED APPLICATION(S)

This application is a continuation of International Application No. PCT/JP2007/070071, filed on Oct. 15, 2007, the entire contents of which are incorporated herein by reference.

FIELD

The embodiments discussed herein are directed to a simulation method, an electronic apparatus design method, a simulation program, and a simulation apparatus.

BACKGROUND

When the performance of a test target device (Electronic Device) such as an LSI (Large Scale Integration), a system LSI, and a SoC (System on Chip) is evaluated, a simulation apparatus has been conventionally used. The simulation apparatus simulates an operation of a test model, which is a modeled version of the test target device, using an ISS (Instruction Set Simulator) (see Japanese Laid-open Patent Publication No. 2004-13227, Japanese Laid-open Patent Publication No. 2006-23852, Japanese Laid-open Patent Publication No. 11-96130, Japanese Laid-open Patent Publication No. 2003-15914, Japanese Laid-open Patent Publication No. 05-158740, and Japanese Laid-open Patent Publication No. 2001-249829).

Specifically, in a conventional technique, hardware of the test model is modeled by Verilog-HDL (Hardware Description Language) at RTL (Register Transfer Level) or SystemC with TLM (Transaction Level Modeling). Regarding software executed on the test model, an execution binary is created by compiling a program described in a C language or an assembly language.

In the conventional technique, by causing the test model to execute the execution binary, the test target device is simulated, and by monitoring each hardware item while the simulation is executed, a simulation result such as a command execution time of the test target device is obtained.

However, a long time is spent for simulating an operation of the test target device in the conventional technique described above.

Specifically, in the conventional technique, complex processing in which the ISS reads the execution binary and executes a command of the execution binary is executed, and hence a long time is spent for simulation on the ISS.

Even when evaluating the performance of the test target device without using the ISS, in the conventional technique, complex processing such as converting the execution binary into a host code is performed (see Japanese Laid-open Patent Publication No. 2004-13227).

SUMMARY

According to an aspect of an embodiment of the invention, a simulation method includes obtaining an execution log generated while a predetermined processing is executed by simulating a series of operations in a test model that is a modeled version of a test target device by causing a predetermined processing to be executed in the test model, and, extracting a processing unit log constituted by a predetermined processing unit from the execution log obtained in the obtaining, and simulating an operation in which processing corresponding to the processing unit log extracted in the extracting is executed in a test model in which a part of function of the test target device is modified, the operation being simulated on the basis of a setting condition set by a user.

According to another aspect of an embodiment of the invention, a method for designing an electronic apparatus, the method includes obtaining an execution log generated while a predetermined processing is execute by simulating a series of operations in a test model that is a modeled version of a test target device by causing a predetermined processing to be executed in the test model, and extracting a processing unit log constituted by a predetermined processing unit from the execution log obtained in the obtaining, simulating an operation in which processing corresponding to the processing unit log extracted in the extracting is executed in a test model in which a part of function of the test target device is modified, the operation being simulated on the basis of a setting condition set by a user, and designing an electronic apparatus by using a simulation result in the simulating.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIG. 1 is an illustration for explaining an outline and features of a simulation apparatus according to a first embodiment;

FIG. 2 is a block diagram illustrating a configuration of the simulation apparatus;

FIG. 5 is a diagram illustrating an example of information stored in a processing unit log storage section of the simulation apparatus;

FIG. 6 is a diagram illustrating an example of information stored in a setting condition storage section of the simulation apparatus;

FIG. 7 is a diagram illustrating an example of information stored in a simulation result storage section of the simulation apparatus;

FIG. 10 is a diagram illustrating an example of information stored in an execution log storage section of a simulation apparatus according to a second embodiment;

FIG. 11 is a diagram illustrating an example of information stored in a processing unit log storage section of the simulation apparatus according to the second embodiment;

FIG. 16 is a diagram illustrating an example of information stored in a processing unit log storage section according to a fourth embodiment.

DESCRIPTION OF EMBODIMENT(S)

Figure 3:
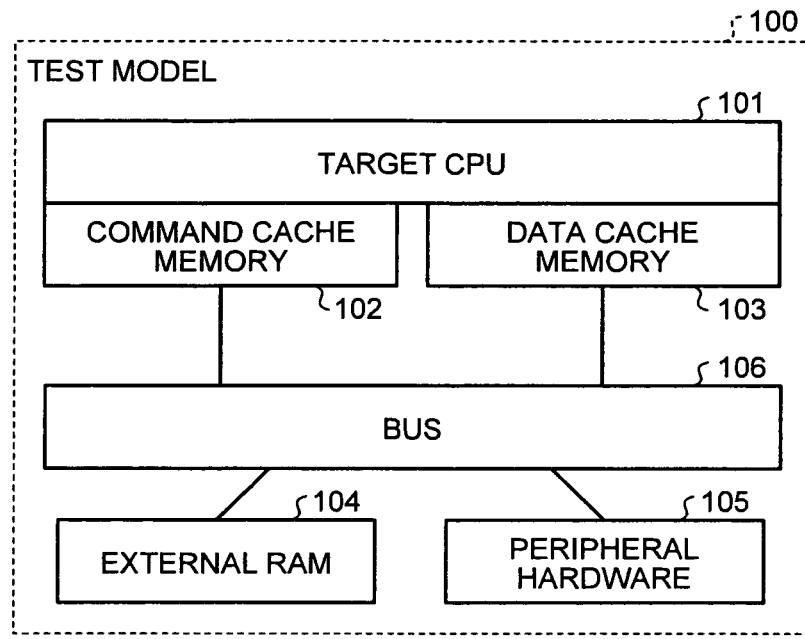
FIG. 3 is a diagram illustrating an example of information stored in a test model storage section of the simulation apparatus.

Preferred embodiments of the present invention will be explained with reference to accompanying drawings. In the description below, a simulation apparatus to which the present invention is applied will be described as the embodiments.

Explanations of Terms

First, main terms used in the embodiments will be explained. The "modeled test target device (test model)" used in the embodiments is a test target device in which each function realized by hardware is described in, for example, Verilog-HDL (Hardware Description Language) at RTL (Register Transfer Level) or SystemC with TLM (Transaction Level Modeling).

The "execution log" used in the embodiments is a history of commands which are actually executed when a simulator such as an ISS causes the test target device to execute software for executing a series of processing operations.

[a] First Embodiment

Hereinafter, an outline and features of a simulation apparatus according to a first embodiment, a configuration of the simulation apparatus, and a process flow of the simulation apparatus will be sequentially described, and finally an effect of the first embodiment will be described.

Outline and Features of Simulation Apparatus

First, the outline and features of the simulation apparatus according the first embodiment will be described with reference to FIG. 1. FIG. 1 is an illustration for explaining the outline and features of the simulation apparatus according to the first embodiment.

The outline of the simulation apparatus according to the first embodiment is that the simulation apparatus simulates an operation of a test target device modeled for evaluating a performance of the test target device, and a main feature of the simulation apparatus is that the simulation apparatus simulates the operation of the test target device in a short time without using complex processing.

Main feature will be described. The simulation apparatus according to the first embodiment simulates a series of operations in a test model when a predetermined processing is executed in the test model which is a modeled test target device, and obtains an execution log generated along with the execution of the predetermined processing (see (1) of FIG. 1). For example, the simulation apparatus according to the first embodiment simulates a series of operations when communication processing is executed in a communication device model, and obtains an execution log generated along with the execution of the communication processing.

Next, the simulation apparatus according to the first embodiment extracts a processing unit log constituted by a predetermined processing unit from the execution log (see (2) of FIG. 1). For example, the simulation apparatus according to the first embodiment extracts a processing unit log about "upward transmission/reception processing", "downward transmission/reception processing" (for example, "transmission/reception processing" including "path search processing", "processing for reading transmission information from buffer", "information transmission processing", and the like) constituted by a predetermined processing unit, and "periodic processing A" which is a periodic interrupt processing from the execution log.

Then, the simulation apparatus according to the first embodiment simulates an operation in which processing corresponding to the processing unit log is executed in a test model in which a part of function of the test target device is modified, on the basis of a setting condition set by a user (see (3) of FIG. 1). For example, the simulation apparatus according to the first embodiment simulates an operation when two times the processing of "upward transmission processing" and "downward reception processing" is executed in a predetermined time in a communication device model whose communication speed is improved by two times, and "periodic processing A" is executed in a half period.

In this way, the simulation apparatus according to the first embodiment can simulate the operation of the test target device in a short time without using complex processing as described in the above main feature.

Configuration of Simulation Apparatus According to First Embodiment

Figure 4:
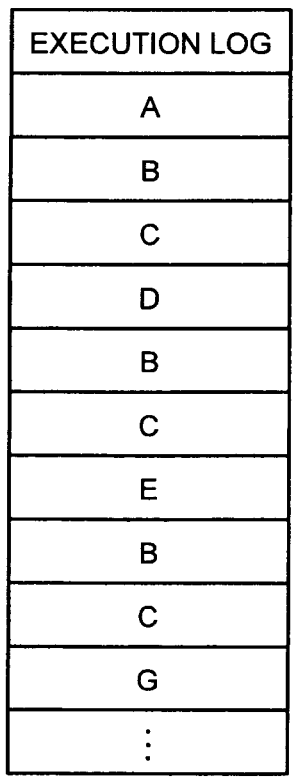
FIG. 4 is a diagram illustrating an example of information stored in an execution log storage section of the simulation apparatus.

Next, the configuration of the simulation apparatus depicted in FIG. 1 will be described with reference to FIGS. 2 to 7. FIG. 2 is a block diagram illustrating the configuration of the simulation apparatus. FIG. 3 is a diagram illustrating an example of information stored in the test model storage section. FIG. 4 is a diagram illustrating an example of information stored in an execution log storage section. FIG. 5 is a diagram illustrating an example of information stored in a processing unit log storage section. FIG. 6 is a diagram illustrating an example of information stored in a setting condition storage section. FIG. 7 is a diagram illustrating an example of information stored in a simulation result storage section.

As depicted in FIG. 2, a simulation apparatus 10 includes an input section 11, an output section 12, a storage section 13, a control section 14, and a simulator 15.

The input section 11 receives inputs of various information. Specifically, the input section 11 includes a keyboard, a mouse, and the like. For example, inputs of the test model, software executed in the test model, and the setting condition are received through the input section 11.

The output section 12 outputs various information. Specifically, the output section 12 includes a monitor, a display, and the like. For example, a simulation result (for example, a CPU load rate of the test target device, a bus occupancy rate, a processing time, a power consumption, a memory usage rate, and the like) is outputted through the output section 12.

The storage section 13 stores data and program for various processing by a control section 14, and includes, in particular as sections closely related to the present invention, a test model storage section 13a, an execution log storage section 13b, a processing unit log storage section 13c, a setting condition storage section 13d, and a simulation result storage section 13e.

The test model storage section 13a stores the test model. A specific example will be described. As depicted in FIG. 3, the test model storage section 13a stores a test model 100 including a target CPU 101, a command cache memory 102, a data cache memory 103, an external RAM 104, peripheral hardware 105, and a bus 106.

Here, the target CPU 101 is a CPU as the test model 100. The command cache memory 102 is a storage section for temporarily storing a command statement for the target CPU 101 to obtain the command statement of a predetermined command processing in a short time. The data cache memory 103 is a storage section for temporarily storing a predetermined data used when the test model operates for the target CPU 101 to obtain the predetermined data in a short time.

The external RAM 104 is a storage section for storing a command statement and use data for a long time. The peripheral hardware 105 is an external interface and dedicated hardware for specific usage. The target CPU 101, the command cache memory 102, and the data cache memory 103 are connected to the external RAM 104 and the peripheral hardware 105 via the bus 106.

The execution log storage section 13b stores the execution log. A specific example will be described. As depicted in FIG. 4, the execution log storage section 13b stores the execution log which means that processing corresponding to each log has been executed in an order of log "A", log "B", log "C", . . . , along with an execution of a predetermined operation, as an execution log generated along with the execution of the predetermined operation in the test model. Here, the log "A", log "B", log "C", . . . correspond to, for example, logs such as "path search processing", "processing for reading transmission information from buffer", and "information transmission processing" in the communication processing in the communication device model.

The processing unit log storage section 13c stores the processing unit log. A specific example will be described. As depicted in FIG. 5, the processing unit log storage section 13c stores logs of processing executed when events are executed, while the logs are divided by each event executed by the test model, as a processing unit log constituted by a predetermined processing unit from the execution log. Here, the "event" corresponds to the "upward transmission processing", the "downward reception processing", and the "periodic processing A" in the communication device model, and means that processing corresponding to the log "B" is executed when the event "1" is executed, and thereafter processing corresponding to the log "C" is executed.

The setting condition storage section 13d stores the setting condition. A specific example will be described. As depicted in FIG. 6, the setting condition storage section 13d associates the events with the cycles in which the events are executed (for example, associates the event "1" with the cycle "1 second") and stores the cycles and events as a setting condition for executing the event "1" in a cycle of 1 second, executing the event "2" in a cycle of 2 seconds, and executing the event "3" in a cycle of 3 seconds in a test model in which a part of the function of the test target device is modified.

The simulation result storage section 13e stores a simulation result of a test model in which a part of the function of the test target device is modified. A specific example will be described. As depicted in FIG. 7, the simulation result storage section 13e stores the CPU load rate (for example, 20%), the bus occupancy rate (for example, 10%), a the processing time (for example, 1 minute), the power consumption (for example, 60 W (watts)), and the memory usage rate (for example, 70%) as a simulation result of a test model in which a part of the function of the test target device is modified.

The control section 14 includes an internal memory for storing a predetermined control program, a program specifying various process procedures and the like, and data, and executes various processing by using the programs and data. The control section 14 includes, in particular as sections closely related to the present invention, a test model storing section 14a, an execution log obtaining section 14b, a processing unit log extraction section 14c, and a simulator control section 14d. The execution log obtaining section 14b corresponds to "execution log obtaining section" described in the claims, and the processing unit log extraction section 14c corresponds to "processing unit log extraction section" described in the claims.

The test model storing section 14a stores a test model. Specifically, when receiving a test model through the input section 11, the test model storing section 14a stores the test model in the test model storage section 13a.

The execution log obtaining section 14b simulates a series of operations in a test model when a predetermined processing is executed in the test model which is a modeled test target device, and obtains an execution log generated along with the execution of the predetermined processing.

Specifically, when receiving temporary software for executing a predetermined processing in the test model through the input section 11, the execution log obtaining section 14b reads the test model from the test model storage section 13a, inputs the test model and the temporary software into the simulator 15, and causes the simulator 15 to simulate a series of processing operations in the test model when the predetermined processing is executed in the test model. Then, the execution log obtaining section 14b receives an execution log generated along with the execution of the predetermined processing from the simulator 15, and stores the execution log in the execution log storage section 13b (see FIG. 4).

For example, when receiving temporary software for executing a communication processing in the communication model through the input section 11, the execution log obtaining section 14b causes the simulator 15 to simulate a series of processing operations when the communication processing is executed, receives an execution log which means that processing corresponding to each log has been executed in an order of log "A", log "B", log "C", . . . , and stores the execution log in the execution log storage section 13b.

Here, the temporary software is, for example, software having a performance which can creates a sufficient load (for example, a delay time in the path search processing) when the simulator 15 using a real time OS (Real-Time Operating System) simulates a series of processing operations when executing a predetermined processing.

The processing unit log extraction section 14c extracts a processing unit log constituted by a predetermined processing unit from the execution log. Specifically, when the execution log is stored in the execution log storage section 13b by the execution log obtaining section 14b, the processing unit log extraction section 14c reads the execution log from the execution log storage section 13b, extracts the processing unit logs constituted by the predetermined processing unit, sorts the processing unit logs for each event executed by the test model, and stores the logs generated when the events are executed in the processing unit log storage section 13c (see FIG. 5).

For example, by searching a repetition of the same logs (for example, a repetition of generation of the log "B" and the log "C" in this order) from the execution log, and a location of a log generated when the OS starts a task, the processing unit log extraction section 14c extracts logs generated when the events are executed, and stores the logs in the processing unit log storage section 13c.

It is possible to insert an explicit partition (for example, command processing corresponding to a predetermined command) in the temporary software for executing a predetermined processing in the test model, and the processing unit log extraction section 14c may extract a processing unit log by referring to a log of the explicit partition.

When receiving a setting condition through the input section 11, the simulator control section 14d stores the setting condition in the setting condition storage section 13d (see FIG. 6). Then, the simulator control section 14d reads the test model from the test model storage section 13a. Further, the simulator control section 14d reads the processing unit log from the processing unit log storage section 13c. Then, the simulator control section 14d inputs the test model, the processing unit log, and the setting condition into the simulator 15, and causes the simulator 15 to simulate an operation of a test model in which a part of the function of the test target device is modified.

The simulator control section 14d receives a simulation result of the operation of the test model in which a part of the function of the test target device is modified from the simulator 15, stores the simulation result in the simulation result storage section 13e, and outputs the simulation result through the output section 12.

The simulator 15 simulates a series of operations in the test model. Specifically, when receiving the test model and the temporary software from the execution log obtaining section 14b, the simulator 15 compiles the temporary software to create an execution binary, executes a simulation in which the execution binary is executed by the test model, and creates an execution log. Then the simulator 15 transmits the created execution log to the execution log obtaining section 14b.

Also, the simulator 15 simulates an operation in which processing corresponding to a processing unit log is executed, on the basis of a setting condition set by a user.

Specifically, when receiving the test model, the processing unit log, and the setting condition from the simulator control section 14d, the simulator 15 simulates an operation in which processing corresponding to a processing unit log is executed, by the operation of a test model in which a part of the function of the test target device is modified, on the basis of a setting condition set by a user. Then, the simulator 15 outputs the simulation result to the simulator control section 14d.

For example, the simulator 15 simulates an operation of the test model in which the event "1" is executed in a cycle of 1 second, the event "2" is executed in a cycle of 2 seconds, and the event "3" is executed in a cycle of 3 seconds. The simulator 15 calculates the CPU load rate, the bus occupancy rate, the processing time, the power consumption, and the memory usage rate as a simulation result, and transmits them to the simulator control section 14d. The simulator 15 corresponds to "simulation section" in the claims.

Processing of Simulation Apparatus According to First Embodiment

Figure 8:
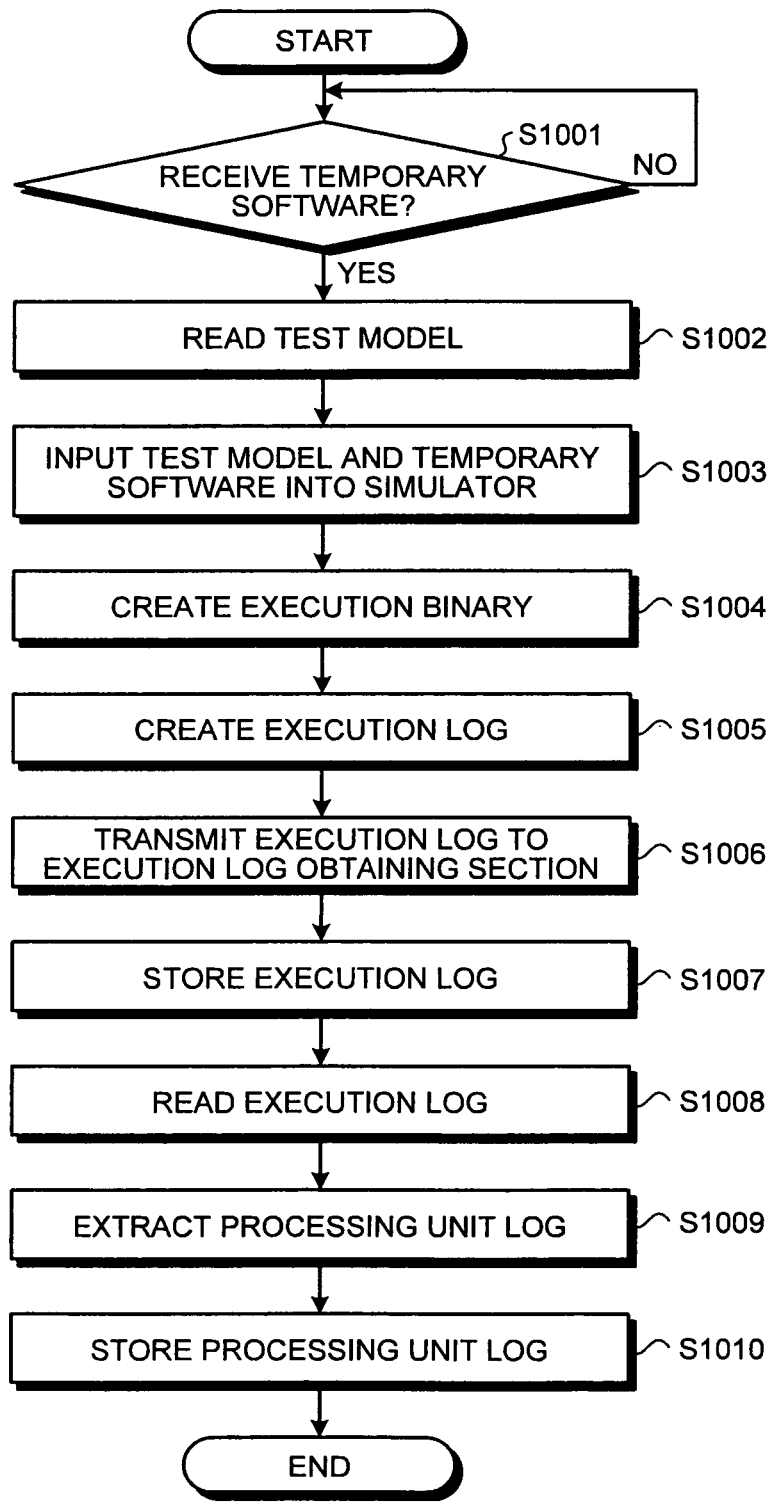
FIG. 8 is a flowchart illustrating a process flow of the simulation apparatus when extracting a processing unit log.
Figure 9:
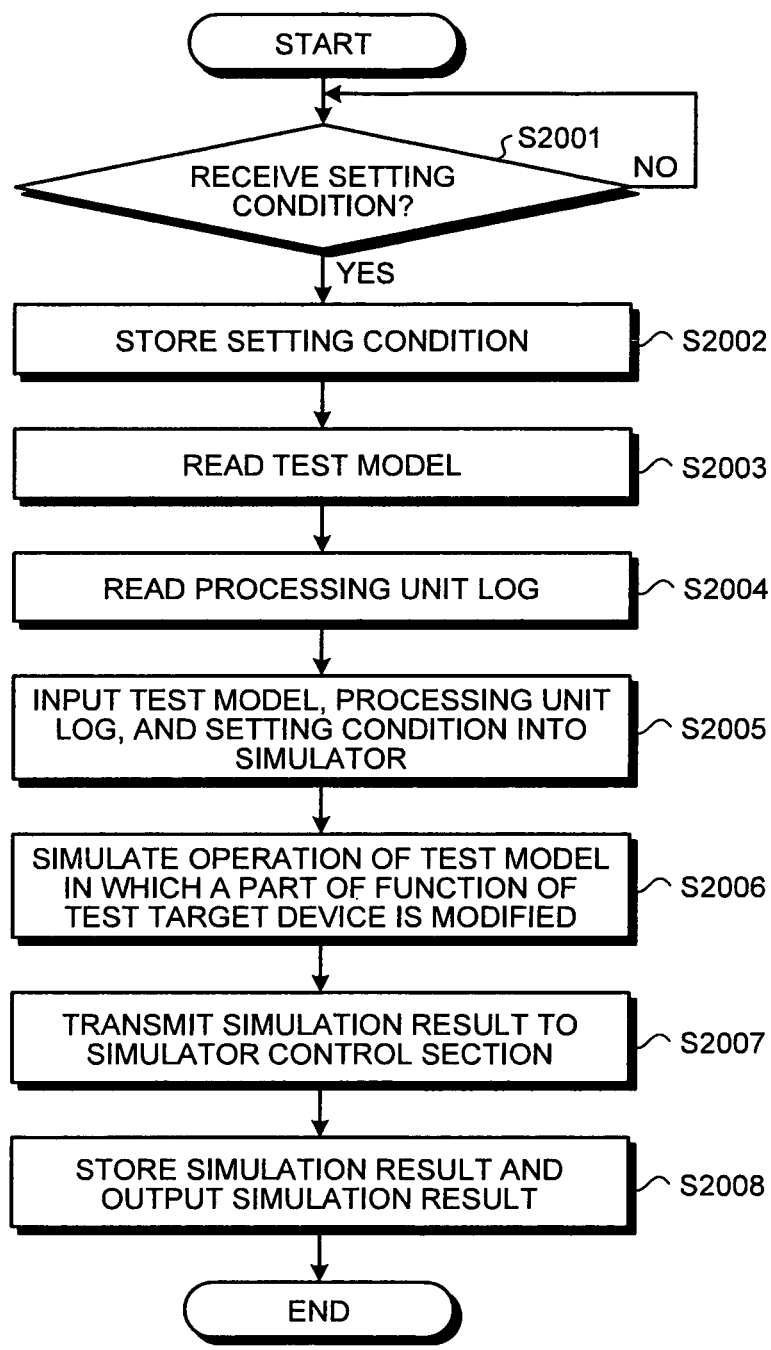
FIG. 9 is a flowchart illustrating a process flow of the simulation apparatus when simulating an operation of a test model in which a part of function of a test target device is modified.

Next, the processing of the simulation apparatus according to the first embodiment will be described with reference to FIGS. 8 and 9. FIG. 8 is a flowchart illustrating a process flow of the simulation apparatus when extracting a processing unit log. FIG. 9 is a flowchart illustrating a process flow of the simulation apparatus when simulating an operation of a test model in which a part of the function of the test target device is modified. Hereinafter, each process flow will be described assuming that the test model is stored in the test model storage section 13a by the test model storing section 14a.

Processing of Simulation Apparatus when Extracting Processing Unit Log

As depicted in FIG. 8, when receiving the temporary software for executing a predetermined processing in the test model through the input section 11 (step S1001, Yes), the execution log obtaining section 14b reads the test model from the test model storage section 13a (step S1002), and inputs the test model and the temporary software into the simulator 15 (step S1003).

The simulator 15, which receives the test model and the temporary software, compiles the temporary software to create an execution binary (step S1004), executes a simulation to create an execution log (step S1005), and transmits the execution log to the execution log obtaining section 14b (step S1006).

The execution log obtaining section 14b which receives the execution log stores the execution log in the execution log storage section 13b (step S1007).

Next, the processing unit log extraction section 14c reads the execution log from the execution log storage section 13b (step S1008), extracts a processing unit log constituted by a predetermined processing unit from the execution log (step S1009), stores the processing unit log in the processing unit log storage section 13c (step S1010), and ends the processing of extracting the processing unit log from the execution log.

Processing of Simulation Apparatus when Simulating Operation of Test Model in which Part of Function of Test Target Device is Modified As depicted in FIG. 9, when receiving a setting condition (step S2001, Yes), the simulator control section 14d stores the setting condition in the setting condition storage section 13d (step S2002).

Next, the simulator control section 14d reads the test model from the test model storage section 13a (step S2003), reads the processing unit log from the processing unit log storage section 13c (step S2004), and inputs the test model, the processing unit log, and the setting condition into the simulator 15 (step S2005).

The simulator 15, which receives the test model, the processing unit log, and the setting condition from the simulator control section 14d, simulates an operation of a test model in which a part of the function of the test target device is modified (step S2006), and transmits the simulation result to the simulator control section 14d (step S2007).

The simulator control section 14d, which receives the simulation result, stores the simulation result in the simulation result storage section 13e, and outputs the simulation result through the output section 12 (step S2008), and ends the processing of simulating the operation of the test target device.

Effect of First Embodiment

As described above, according to the first embodiment, a series of operations is simulated in a test model when a predetermined processing is executed in the test model which is a modeled test target device, an execution log generated along with the execution of the predetermined processing is obtained, a processing unit log constituted by a predetermined processing unit is extracted from the execution log, and an operation is simulated on the basis of the setting condition set by a user when processing corresponding to the processing unit log is executed in a test model in which a part of the function of the test target device is modified. Therefore, it is possible to simulate the operation of the test target device in a short time without using complex processing.

[b] Second Embodiment

By the way, it may be desirable to simulate the test target device at a level of abstraction at which an operation of the cache memory can be analyzed. For example, a usage rate of the external RAM 104, a hit rate (command cache hit rate) when reading a command statement of a predetermined command processing from the command cache memory 102, a hit rate (data cache hit rate) when reading a predetermined data from the data cache memory 103, a processing time (command fetch time) for reading a command statement of a predetermined command processing from the external RAM 104, a processing time for reading/writing a predetermined data from/to a storage section mounted in the peripheral hardware 105, an idle time of the target CPU 101, and the like may be necessary as a result. Therefore, in the second embodiment, a case will be described in which an operation of the test target device is simulated at a level of abstraction at which an operation of the cache memory can be analyzed. In the second embodiment, a configuration of the simulation apparatus according to the second embodiment and a process flow of the simulation apparatus will be described, and thereafter an effect of the second embodiment will be described.

Configuration of Simulation Apparatus According to Second Embodiment

Next, the configuration of the simulation apparatus according to the second embodiment will be described with reference to FIGS. 10 and 11. FIG. 10 is a diagram illustrating an example of information stored in the execution log storage section of the simulation apparatus according to the second embodiment. FIG. 11 is a diagram illustrating an example of information stored in the processing unit log storage section of the simulation apparatus according to the second embodiment.

The configuration of a simulation apparatus according to the second embodiment is different from that of the simulation apparatus 10 according to the first embodiment in the points described below.

As depicted in FIG. 10, the execution log storage section 13b associates a label showing a processing content when logs are generated as an execution log with each log of the execution log and stores the logs. Specifically, the execution log storage section 13b associates a label (for example, label "command") indicating that a predetermined command processing is executed with a log (for example, log "A") generated along with an execution of the predetermined command processing, and stores the label and the log.

Also, the execution log storage section 13b associates a label (for example, label "reading data") indicating that reading processing for reading a predetermined data from a storage section is executed with a log (for example, log "C") generated along with an execution of the reading processing for reading a predetermined data from the storage section, and stores the label and the log.

Also, the execution log storage section 13b associates a label (for example, label "writing data") indicating that writing processing for writing a predetermined data to a storage section is executed with a log (for example, log "D") generated along with an execution of the writing processing for writing a predetermined data to the storage section, and stores the label and the log.

The processing unit log storage section 13c associates a label indicating a processing content with a log generated when each event is generated, and stores the label and the log as a processing unit log. A specific example will be described. As depicted in FIG. 11, the processing unit log storage section 13c associates the label "command" with the log "B" and stores the label and the log, and associates the label "reading data" with the log "C" and stores the label and the log, as the event "1" indicating that the command processing corresponding to the log "B" is executed and thereafter the reading processing corresponding to the log "C" is executed.

The execution log obtaining section 14b receives an execution log from the simulator 15, and associates labels indicating a processing content with each log of the execution log, and stores the logs and labels in the execution log storage section 13b (see FIG. 10).

The processing unit log extraction section 14c extracts processing unit logs constituted by a predetermined processing unit from the execution log, sorts the logs by the events executed by the test model, associates labels indicating a processing content with logs generated when each event is executed, and stores the labels and logs in the processing unit log storage section 13c (see FIG. 11).

Then, the simulator control section 14d reads the test model 100 including the command cache memory 102, the data cache memory 103, the external RAM 104, and the peripheral hardware 105 from the test model storage section 13a, and inputs the test model, the processing unit log, and the setting condition into the simulator 15, and causes the simulator 15 to simulate an operation of a test model in which a part of the function of the test target device is modified.

When receiving the test model and the temporary software from the execution log obtaining section 14b, the simulator 15 executes a simulation, creates an execution log while providing labels indicating a processing content to each log of the execution log, and transmits the execution log to the execution log obtaining section 14b.

When receiving the test model, the processing unit log, and the setting condition from the simulator control section 14d, the simulator 15 simulates an operation of a test model in which a part of the function of the test target device is modified, at a level of abstraction at which an operation of the cache memory can be analyzed.

Here, an example of a simulation, which is executed by the simulator 15, of an operation of the test model at a level of abstraction at which an operation of the cache memory can be analyzed will be described. The simulator 15 is assumed to simulate an operation of the test model 100 as depicted in FIG. 3 on the basis of the setting condition depicted in FIG. 6, and measure a processing time for executing a series of processing operations.

After starting the simulation of operation of the test model, when it gets to the time to execute a predetermined event, the simulator 15 reads the log of the predetermined event and the label corresponding to the log from the processing unit log, and determines whether the processing of the predetermined event is command processing or read/write processing by using the label corresponding to the log.

When the processing of the predetermined event is command processing, the simulator 15 performs a simulation in which the simulator 15 reads a command statement from a storage section and executes the command processing.

Specifically, when the simulator 15 executes command processing, the simulator 15 determines whether or not a command statement is stored in the command cache memory 102. When the command statement is determined to be stored in the command cache memory 102, the simulator 15 reads the command statement from the command cache memory 102, and when the command statement is determined not to be stored in the command cache memory 102, the simulator 15 reads the command statement from the external RAM 104. Then, the simulator 15 executes the command processing.

For example, when the command statement is determined to be stored in the command cache memory 102, the simulator 15 measures a time (time corresponding to average CPI) spent by the target CPU 101 to execute the command processing as a processing time.

When the command statement is determined not to be stored in the command cache memory 102, the simulator 15 measures a time spent by the target CPU 101 to execute a line fetch from the bus 106 (for example, processing for continuously reading 8 command statements from the external RAM 104) as a processing time, and further measures a time spent by the target CPU 101 to execute the command processing as a processing time.

On the other hand, when the processing of the predetermined event is read/write processing, the simulator 15 performs a simulation in which the simulator 15 writes a predetermined data to the storage section or reads a predetermined data stored in the storage section.

Specifically, when executing the read/write processing, the simulator 15 determines whether the processing is processing for reading a predetermined data from the storage section or processing for writing a predetermined data to the storage section by using the label corresponding to a log of the predetermined event.

Here, when the processing is determined to be processing for reading a predetermined data, the simulator 15 determines whether the predetermined data is stored in the data cache memory 103 or the external RAM 104 by checking the data cache memory 103 first, and performs a simulation in which the predetermined data is read.

For example, when the predetermined data is stored in the data cache memory 103, the simulator 15 measures a time spent by the target CPU 101 to read the predetermined data from the data cache memory 103 as a processing time, and when the predetermined data is not stored in the data cache memory 103, the simulator 15 measures a time spent by the target CPU 101 to perform a line fetch from the external RAM 104 to the data cache memory 103 (processing for transferring the predetermined data from the external RAM 104 to the data cache memory 103) as a processing time.

When the processing is determined to be processing for writing a predetermined data, the simulator 15 determines whether the predetermined data is to be stored in the data cache memory 103 or another storage section (for example, the storage section mounted in the peripheral hardware 105) by checking the data cache memory 103 first, and performs a simulation in which the predetermined data is written.

For example, when determining that the predetermined data is to be stored in the data cache memory 103, the simulator 15 measures a time spent by the target CPU 101 to store the predetermined data in the data cache memory 103 as a processing time, and when determining that the predetermined data is to be stored in another storage section, the simulator 15 measures a time spent by the target CPU 101 to store the predetermined data in another storage section as a processing time.

In this way, the simulator 15 executes the next processing of the predetermined event in the same way as the simulation as described above until the processing operations of the predetermined event are completed. The simulator 15 executes processing operations of a predetermined event in an order in which the logs are generated in a cycle of each event.

When the simulation ends, the simulator 15 sums up processing times spent for executing each processing operation, and transmits the summing-up result to the simulator control section 14d as a simulation result.

Processing of Simulator in Simulation Apparatus

Figure 12:
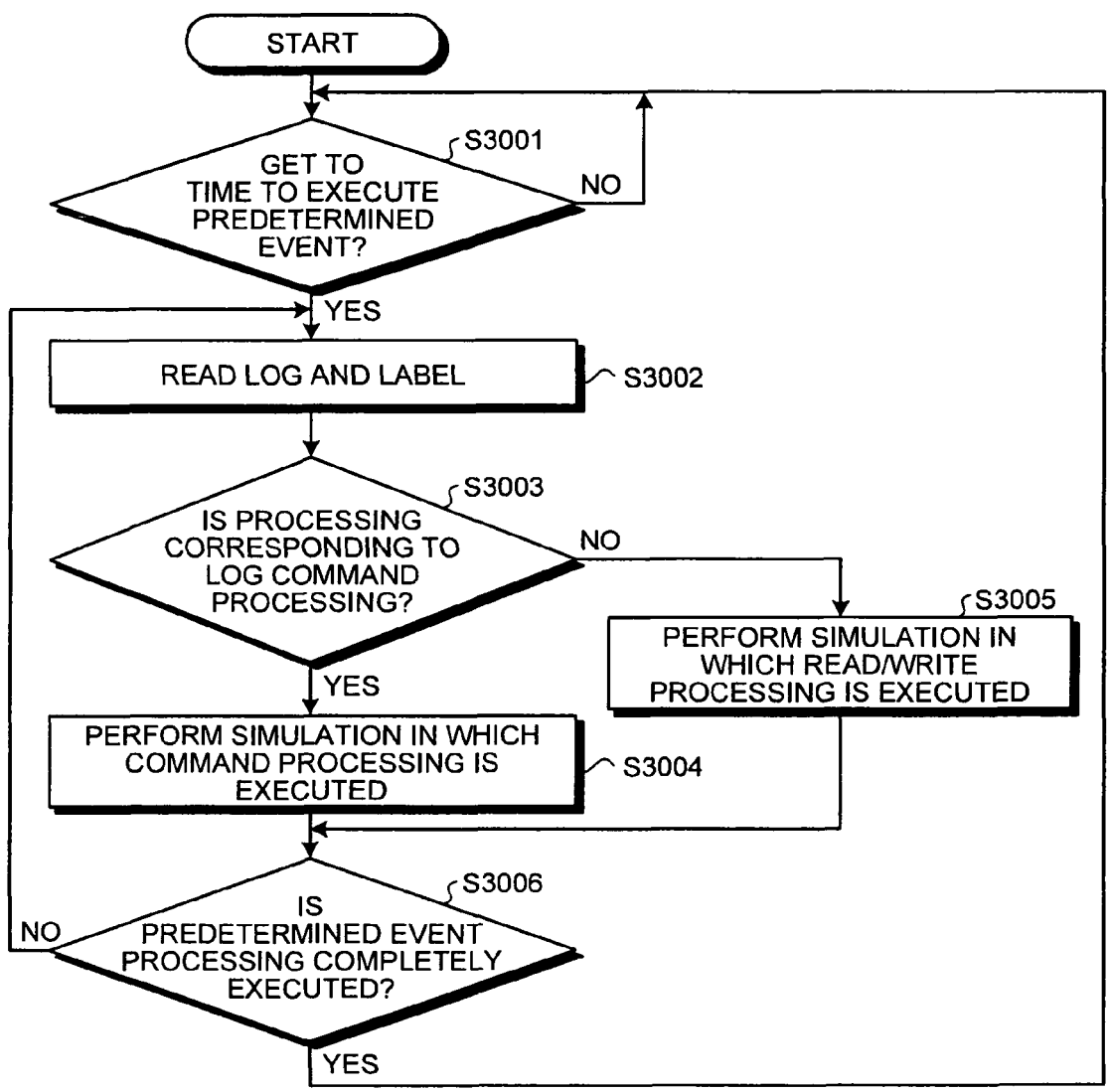
FIG. 12 is a flowchart illustrating a process flow of a simulator when a part of the function of the test target device is modified.
Figure 13:
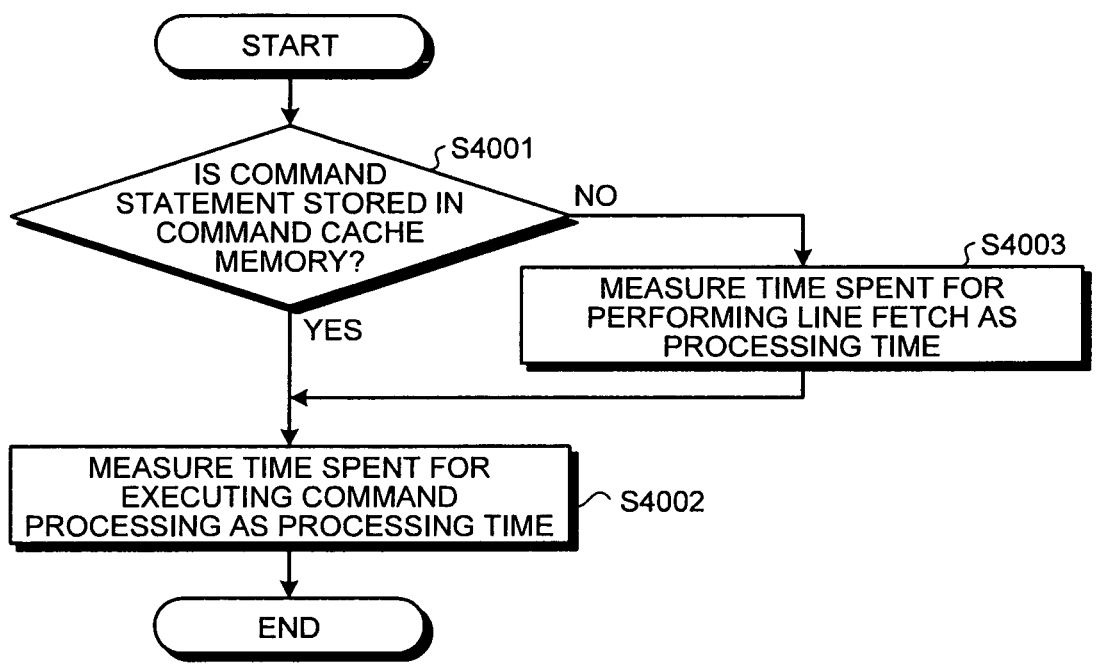
FIG. 13 is a flowchart illustrating a process flow of the simulator of the simulation apparatus when executing command processing.
Figure 14:
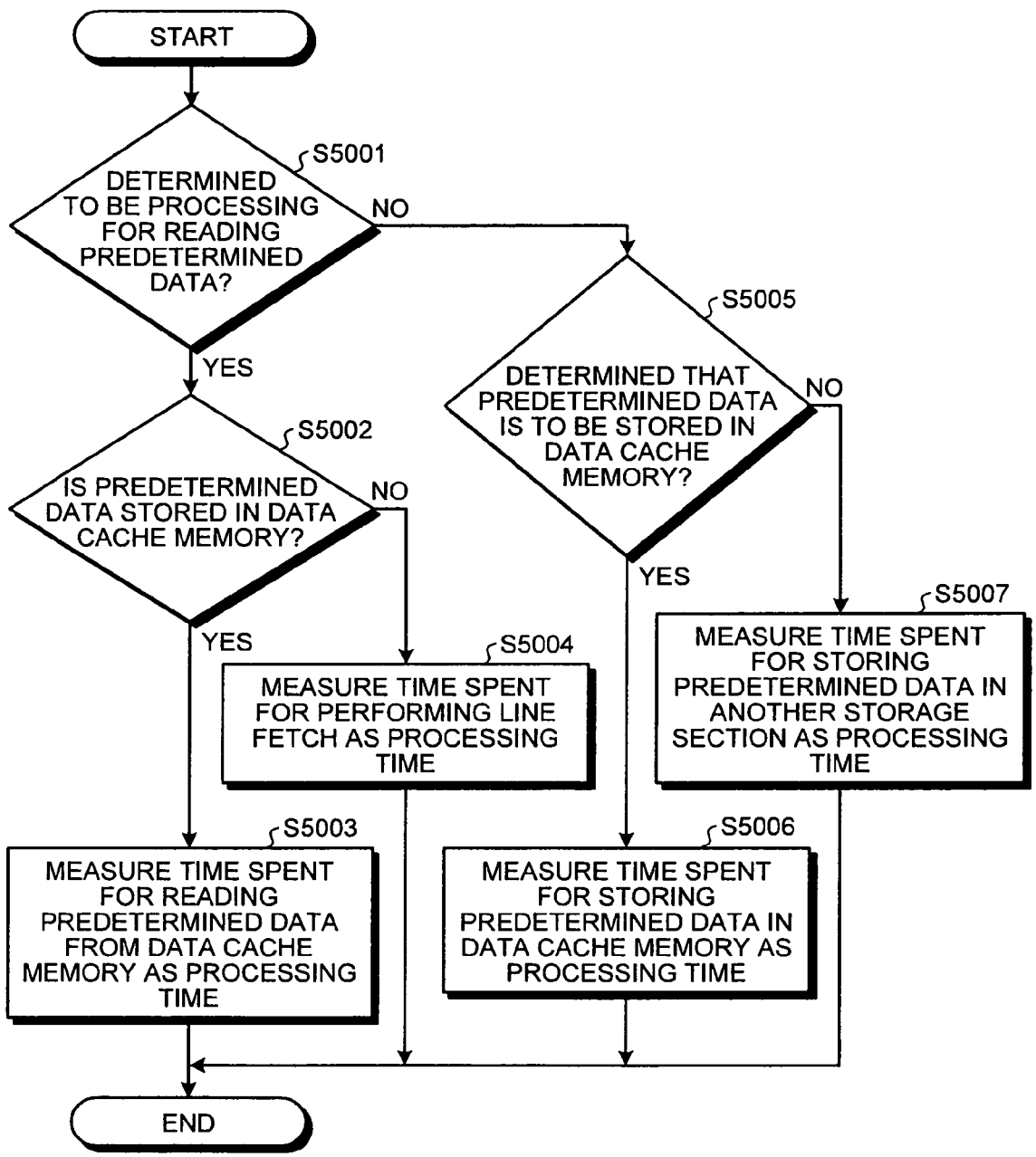
FIG. 14 is a flowchart illustrating a process flow of the simulator of the simulation apparatus when executing read/write processing.

Next, processing of the simulator 15 in the simulation apparatus according to second embodiment will be described with reference to FIGS. 12 to 14. FIG. 12 is a flowchart illustrating a process flow of the simulator when a part of the function of the test target device is modified. FIG. 13 is a flowchart illustrating a process flow of the simulator of the simulation apparatus when executing command processing. FIG. 14 is a flowchart illustrating a process flow of the simulator of the simulation apparatus when executing read/write processing.

Processing of Simulator when Part of Function of Test Target Device is Modified

First, with reference to FIG. 12, processing of the simulator 15 will be described from the time when starting the simulation of an operation of a test model in which a part of the function of test target device is modified, to the time when completing the simulation. The processing of the simulator 15 described below is repeatedly executed while the simulation is performed, and is completed when the simulation ends.

As depicted in FIG. 12, when it gets to the time to execute a predetermined event (step S3001, Yes), the simulator 15 reads the log of the predetermined event and the label corresponding to the log from the processing unit log (step S3002), and determines whether the processing of the predetermined event is the command processing or the read/write processing by using the label corresponding to the log (step S3003).

When the processing of the predetermined event is determined to be the command processing (step S3003, Yes), the simulator 15 performs a simulation of executing the command processing (step S3004).

On the other hand, when the processing of the predetermined event is determined to be the read/write processing (step S3003, No), the simulator 15 performs a simulation of executing the read/write processing (step S3005).

When completing the simulation of executing the command processing (step S3004) or the read/write processing (step S3005), the simulator 15 determines whether the processing of the predetermined event is completely executed (step S3006).

When the processing of the predetermined event is determined to be completely executed (step S3006, Yes), the simulator 15 waits until it gets to the time to execute the predetermined event again (step S3001).

On the other hand, when the processing of the predetermined event is determined not to be completely executed (step S3006, No), the simulator 15 reads the log of the predetermined event and the label corresponding to the log from the processing unit log (step S3002), and repeats the processing described above until the processing of the predetermined event is completely executed (step S3006, Yes).

Processing of Simulator in Simulation Apparatus when Executing Command Processing Next, a process flow of the processing of the simulator in the simulation apparatus when executing the command processing (step S3004 in FIG. 12) will be described with reference to FIG. 13. As described in FIG. 13, when executing the command processing, the simulator 15 determines whether or not a command statement is stored in the command cache memory 102 (step S4001).

When the command statement is determined to be stored in the command cache memory 102 (step S4001, Yes), the simulator 15 measures a time spent by the target CPU 101 to execute the command processing as a processing time (step S4002), and ends the processing of executing the command processing.

On the other hand, when the command statement is determined not to be stored in the command cache memory 102 (step S4001, No), the simulator 15 measures a time spent by the target CPU 101 to perform a line fetch from the bus 106 as a processing time (step S4003), measures a time spent by the target CPU 101 to execute the command processing as a processing time (step S4002), and ends the processing of executing the command processing.

Processing of Simulator in Simulation Apparatus when Executing Read/Write Processing Next, a process flow of the processing of the simulator in the simulation apparatus when executing the read/write processing (step S3005 in FIG. 12) will be described with reference to FIG. 14. As depicted in FIG. 14, when executing the read/write processing, the simulator 15 determines whether the processing is processing for reading a predetermined data from the storage section or processing for writing a predetermined data to the storage section by using the label corresponding to the log of the predetermined event (step S5001).

When the processing is determined to be processing for reading a predetermined data (step S5001, Yes), the simulator 15 determines whether the predetermined data is stored in the data cache memory 103 or the external RAM 104 by checking the data cache memory 103 first (step S5002).

When the predetermined data is stored in the data cache memory 103 (step S5002, Yes), the simulator 15 measures a time spent by the target CPU 101 to read the predetermined data from the data cache memory 103 as a processing time (step S5003), and ends the processing of executing the read/write processing.

When the predetermined data is not stored in the data cache memory 103 (step S5002, No), the simulator 15 measures a time spent by the target CPU 101 to perform a line fetch from the external RAM 104 to the data cache memory 103 as a processing time (step S5004), and ends the processing of executing the read/write processing.

Returning to the description of step S5001, when the processing is determined to be processing for writing a predetermined data (step S5001, No), the simulator 15 determines whether the predetermined data is to be stored in the data cache memory 103 or in another storage section by checking the data cache memory 103 first (step S5005).

When it is determined that the predetermined data is to be stored in the data cache memory 103 (step S5005, Yes), the simulator 15 measures a time spent by the target CPU 101 to store the predetermined data in the data cache memory 103 as a processing time (step S5006), and ends the processing of executing the read/write processing.

When it is determined that the predetermined data is to be stored in another storage section (step S5005, No), the simulator 15 measures a time spent by the target CPU 101 to store the predetermined data in another storage section as a processing time (step S5007), and ends the processing of executing the read/write processing.

Effect of Second Embodiment

As described above, according to the second embodiment, it is determined whether the processing corresponding to the processing unit log is the command processing or the read/write processing. When the processing corresponding to the processing unit log is the command processing, a command statement is read from the storage section and the command processing is executed. When the processing corresponding to the processing unit log is the read/write processing, processing for writing a predetermined data to the storage section or processing for reading a predetermined data stored in the storage section is executed. Therefore, the operation of the test target device can be correctly simulated.

Also, according to the second embodiment, when the command processing is executed, whether or not the command statement has been stored in a first storage section is determined. When the command statement is determined to have been stored in the first storage section, the command statement is read from the first storage section. When the command statement is determined not to have been stored in the first storage section, the command statement is read from a second storage section. Therefore, when the command processing is executed, it is possible to simulate the operation of the test target device at a level of abstraction at which an operation of the cache memory can be analyzed.

Also, according to the second embodiment, when the read/write processing is executed, it is determined whether the processing is processing for reading a predetermined data from the storage section or processing for writing a predetermined data to the storage section. When the processing is determined to be the processing for reading the predetermined data from the storage section, it is determined whether the predetermined data is stored in the first storage section or the second storage section by checking the first storage section first, and then the predetermined data is read. When the processing is determined to be the processing for writing the predetermined data, it is determined whether the predetermined data is to be written to the first storage section or the second storage section by checking the first storage section first, and then the predetermined data is written. Therefore, when the read/write processing is executed, it is possible to simulate the operation of the test target device at a level of abstraction at which an operation of the cache memory can be analyzed.

[c] Third Embodiment

By the way, there is a case in which an address of the predetermined data stored in the data cache memory 103 changes in a cyclical manner, and when the operation of the test target device is simulated, it may not be possible to simulate the operation while reflecting the change of the address. Therefore, in the third embodiment, a case will be described in which an offset is provided when the simulator 15 simulates processing of cyclically reading data.

Here, the offset means a control in which the predetermined data is forcibly read from the external RAM 104 even when the predetermined data is stored in the data cache memory 103 to simulate a mishit due to the change of the address of the predetermined data stored in the data cache memory 103.

In the third embodiment, a configuration of the simulation apparatus according to the third embodiment and a process flow of the simulation apparatus will be described, and thereafter an effect of the third embodiment will be described.

Configuration of Simulation Apparatus According to Third Embodiment

First, the configuration of the simulation apparatus according to the third embodiment will be described. The configuration of the simulation apparatus according to the third embodiment is different from that of the simulation apparatus according to the second embodiment in the points described below.

Specifically, when the processing is determined to be processing for reading a predetermined data, the simulator 15 determines whether or not to perform an offset. When performing the offset, the simulator 15 measures a time for performing a line fetch from the external RAM 104 to the data cache memory 103 as a processing time. When not performing the offset, the simulator 15 measures a time spent by the target CPU 101 to read the predetermined data from the data cache memory 103 as a processing time.

For example, the simulator 15 stores the number of execution times of reading the predetermined data in a predetermined storage section, and determines to perform the offset when the number of execution times of reading the predetermined data is greater than or equal to the number of times set by a user.

Figure 15:
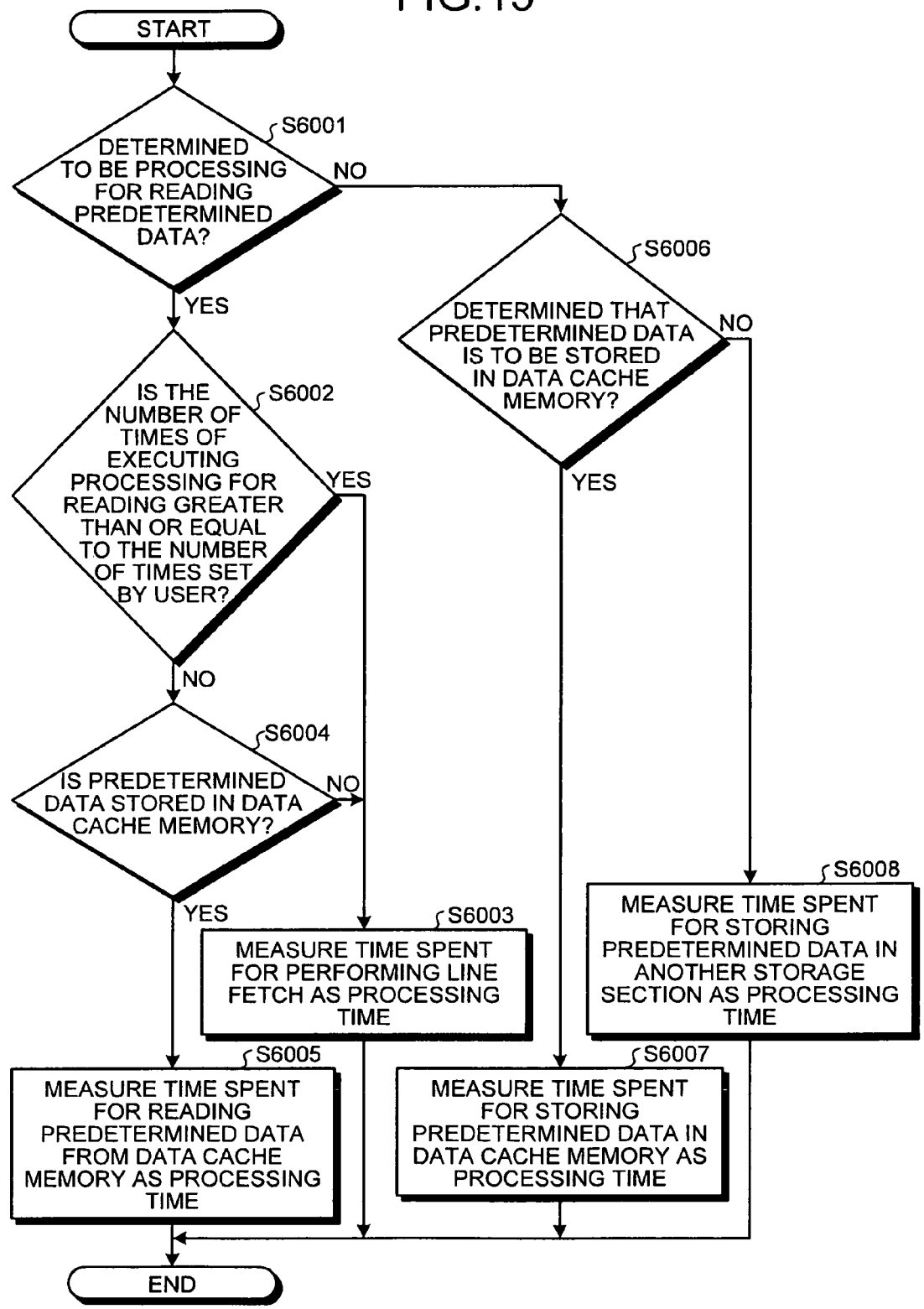
FIG. 15 is a flowchart illustrating a process flow of a simulator of a simulation apparatus according to a third embodiment when executing read/write processing.

Processing of Simulator in Simulation Apparatus According to Third Embodiment when Executing Read/Write Processing Next, processing of the simulator 15 in the simulation apparatus according to the third embodiment when executing the read/write processing will be described with reference to FIG. 15. FIG. 15 is a flowchart illustrating a process flow of the simulator in the simulation apparatus according to the third embodiment when executing read/write processing.

As depicted in FIG. 15, when executing read/write processing, the simulator 15 determines whether the processing is the read processing or the write processing (step S6001), and when the processing is determined to be the read processing (step S6001, Yes), the simulator 15 determines whether or not the number of execution times of reading the predetermined data is greater than or equal to the number of times set by a user (step S6002).

When the number of execution times of reading the predetermined data is determined to be greater than or equal to the number of times set by a user (step S6002, Yes), the simulator 15 measures a time spent by the target CPU 101 to perform a line fetch from the external RAM 104 to the data cache memory 103 as a processing time (step S6003), and ends the processing of executing the read/write processing.

On the other hand, when the number of execution times of reading the predetermined data is determined to be smaller than the number of times set by a user (step S6002, No), the simulator 15 determines whether the predetermined data is stored in the data cache memory 103 or the external RAM 104 by checking the data cache memory 103 first (step S6004).

When the predetermined data is stored in the data cache memory 103 (step S6004, Yes), the simulator 15 measures a time spent by the target CPU 101 to read the predetermined data from the data cache memory 103 as a processing time (step S6005), and ends the processing of executing the read/write processing.

When the predetermined data is not stored in the data cache memory 103 (step S6004, No), the simulator 15 measures a time spent by the target CPU 101 to perform a line fetch from the external RAM 104 to the data cache memory 103 as a processing time (step S6003), and ends the processing of executing the read/write processing.

Returning to the description of step S6001, when the processing is determined to be processing for writing a predetermined data (step S6001, No), the simulator 15 executes the processing in the same way as in the second embodiment.

Specifically, when determining that the predetermined data is to be stored in the data cache memory 103 (step S6006, Yes), the simulator 15 measures a time spent by the target CPU 101 to store the predetermined data in the data cache memory 103 as a processing time (step S6007), and when determining that the predetermined data is to be stored in another storage section (step S6006, No), the simulator 15 measures a time spent by the target CPU 101 to store the predetermined data in another storage section as a processing time (step S6008), and ends the processing of executing the read/write processing.

Effect of Third Embodiment

As described above, according to the third embodiment, an offset is provided to execute the processing when repeatedly executing the processing for reading a predetermined data, so that the operation of the test target device can be simulated more correctly.

[d] Fourth Embodiment

By the way, when the processing corresponding to the processing unit log is processing for continuously executing a plurality of processing operations, the processing corresponding to the processing unit log may be abstracted. Therefore, in the fourth embodiment, a case in which the processing corresponding to the processing unit log is abstracted will be described. Here, to abstract means, for example, to collectively measure the time spent by the target CPU 101 to execute a plurality of continued command processing operations.

In the fourth embodiment, a configuration of the simulation apparatus according to the fourth embodiment and a process flow of the simulation apparatus will be described, and thereafter an effect of the fourth embodiment will be described.

Configuration of Simulation Apparatus According to Fourth Embodiment

First, the configuration of the simulation apparatus according to the fourth embodiment will be described. The configuration of the simulation apparatus according to the fourth embodiment is different from that of the simulation apparatus according to the third embodiment in the points described below.

Specifically, as depicted in FIG. 16, the processing unit log storage section 13c associates a first log in the processing unit log and the number of logs included in the processing unit log with the event executed by the test model, and stores the first log, the number of logs, and the event as a processing unit log. For example, the processing unit log storage section 13c associates a start log "B" which is generated first when the event "1" is executed and the number of logs "4" indicating that the event "1" includes 4 types of processing operations with the event "1", and stores the start log, the number of logs, and the event as a processing unit log. FIG. 16 is a diagram illustrating an example of information stored in the processing unit log storage section 13c according to the fourth embodiment.

The processing unit log extraction section 14c extracts a first log of the processing unit log and the number of logs included in the processing unit log as a processing unit log. Specifically, when receiving a processing unit log extraction command through the input section 11, the processing unit log extraction section 14c reads the execution log from the execution log storage section 13b, divides the execution log for each event executed by the test model, and extracts the first log generated first when an event is executed and the number of the logs generated by executing the event as a processing unit log, and stores the processing unit log in the processing unit log storage section 13c.

The simulator 15 simulates processing corresponding to the processing unit log by using the first log of the processing unit log and the number of logs included in the processing unit log. For example, when it gets to the time to execute the event "1" including 4 types of command processing operations, the simulator 15 reads the start log "B" and the number of logs "4" of the event "1" from the processing unit log. Then, the simulator 15 measures a time spent by the target CPU 101 to execute the first command processing of the event "1", and multiplies the measured time by "4" that is the number of the logs of the event "1" to calculate a time spent by the target CPU 101 to execute the event "1".

Effect of Fourth Embodiment

As described above, according to the fourth embodiment, the first log of the processing unit log and the number of logs included in the processing unit log are extracted, and the processing corresponding to the processing unit log is simulated by using the first log of the processing unit log and the number of logs included in the processing unit log, so that the operation of the test target device can be simulated in a shorter time.

[e] Fifth Embodiment

Although the first embodiment to fourth embodiment have been described, the present invention may be implemented in various different forms in addition to the embodiments described above. Therefore, hereinafter another embodiment will be described as a fifth embodiment.

For example, although, in the first embodiment, a simulation of an operation is described in which the processing corresponding to the processing unit log is executed in the test model (see FIG. 3) including a single target CPU 101, the present invention is not limited to this, and the present invention may be applied to a test model including a single or a plurality of target CPUs.

Also, the present invention may be applied to a test model in which the command cache memory 102 and the data cache memory 103 have a storage section with a hierarchical structure in the test model (see FIG. 3).

Although, in the first embodiment, a case is described in which a series of operations in the test model is simulated to obtain the execution log, the present invention is not limited to this, and the execution log may be obtained from an existing and running electronic apparatus.

Although, in the first embodiment, a case is described where the cycles in which the events are executed are inputted as a setting condition, and the test model where the cycles in which the events are executed are changed is simulated, the present invention is not limited to this. For example, an operation of the test model may be simulated in which a clock frequency or an average processing speed of the target CPU 101, a storage capacity of the command cache memory 102 or the data cache memory 103, a communication rate of the bus 106, or a time spent for performing a line fetch is changed.

Although, in the first embodiment to fourth embodiment, a log of task switching processing by the OS is assumed to be included in the processing unit log, the log of task switching processing by the OS may be taken out as a different log.

In reception processing or the like in the communication processing, when simulating a case in which a transfer rate is changed, not only the frequency of the processing, but also an amount of the processing may be changed. In this case, a predetermined processing unit may be extracted at an appropriate granularity suitable for the object of the simulation so that the variation of the amount of the processing can be changed by changing the frequency of the processing. For example, the "upward transmission processing" as a processing unit may be divided into two processing units of the "path search processing" and the "processing for reading transmission information from buffer" and extracted.

The number of events which are executed at the same time is not limited to one, but a combination of a plurality of events is possible. For example, the event "3" may be executed two times, triggered by executing the event "2" which is executed at a cycle of 2 seconds.

Configuration of Apparatus, and Others

Among the processing operations described in the embodiments, a part of or all of the processing operations which are described to be automatically executed may be manually executed. For example, the processing unit log may be manually extracted from the execution log. A part of or all of the processing operations which are described to be manually executed may be automatically executed by a publicly known method. For example, a design condition is stored in the setting condition storage section 13d in advance, and an operation of a test model in which a part of the function of the test target device is modified may be simulated automatically, triggered by storing the processing unit log in the processing unit log storage section 13c by the processing unit log extraction section 14c.

In addition, processing procedures, control procedures, specific names, various data and information including parameters (for example, a configuration of the test model depicted in FIG. 3, and storage information depicted in FIGS. 4, 5, 6, 7, 10, 11, and 16) may be arbitrary changed unless otherwise described.

Each constituent element of the simulation apparatus depicted in FIG. 2 is functionally conceptual, and need not necessarily be physically constituted as depicted in FIG. 2. In other words, a specific form of distribution and integration of the apparatuses is not limited to the form described in FIG. 2 and part of or all of the apparatuses may be formed by functionally or physically distributing or integrating the apparatuses by an arbitrary unit depending on various loads and usage statuses (for example, in FIG. 2, the control section 14 may be integrated into the simulator 15).

Simulation Program

Figure 17:
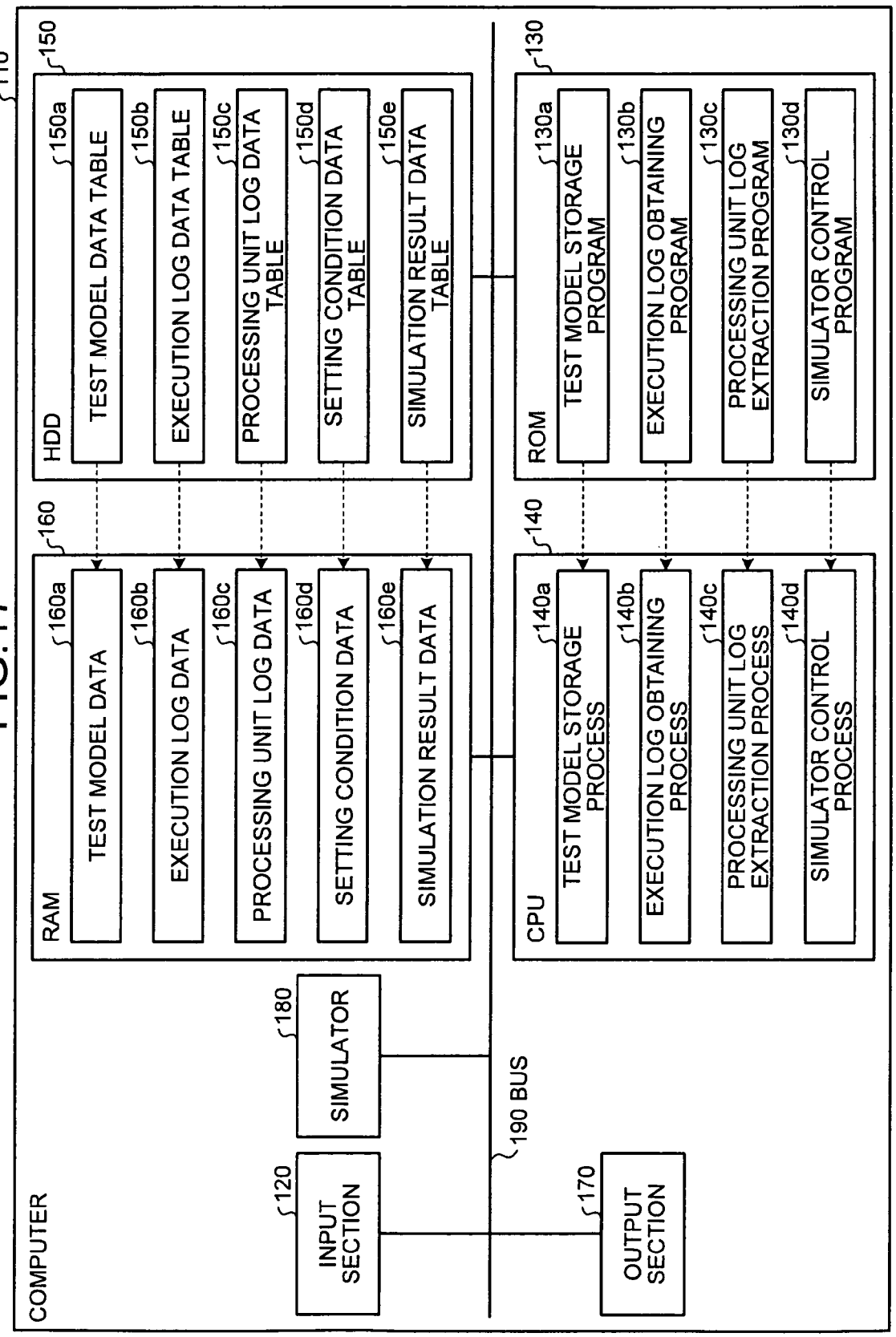
FIG. 17 is a diagram illustrating a computer executing a simulation program.

By the way, the present invention may be realized by executing a simulation program prepared in advance by a computer. Therefore, hereinafter, an example of a computer executing a simulation program having the same function as that of the simulation apparatus depicted in the above embodiments will be described with reference to FIG. 17. FIG. 17 is a diagram illustrating the computer executing the simulation program.

As depicted in FIG. 17, a computer 110 as the simulation apparatus 10 is configured to connect an input section 120, a ROM (Read Only Memory) 130, a CPU (Central Processing Unit) 140, an HDD (Hard Disk Drive) 150, a RAM (Random Access Memory) 160, an output section 170, and a simulator 180 by a bus 190 or the like.

In the ROM 130, the simulation program which performs the same function as that of the simulation apparatus 10 depicted in the above first embodiment, in other words, as depicted in FIG. 17, a test model storage program 130a, an execution log obtaining program 130b, a processing unit log extraction program 130c, and a simulator control program 130d are stored in advance. The programs 130a to 130d may be appropriately integrated or distributed in a similar way to the constituent elements of the simulation apparatus depicted in FIG. 2.

The CPU 140 reads the programs 130a to 130d from the ROM 130 and executes the programs, and accordingly, as depicted in FIG. 17, the programs 130a to 130d function as a test model storage process 140a, an execution log obtaining process 140b, a processing unit log extraction process 140c, and a simulator control process 140d. The process 140a to 140d respectively correspond to the test model storing section 14a, the execution log obtaining section 14b, the processing unit log extraction section 14c, and the simulator control section 14d.

In the HDD 150, as depicted in FIG. 17, a test model data table 150a, an execution log data table 150b, a processing unit log data table 150c, a setting condition data table 150d, and a simulation result data table 150e are respectively provided. The data tables 150a to 150e respectively correspond to the test model storage section 13a, the execution log storage section 13b, the processing unit log storage section 13c, the setting condition storage section 13d, and the simulation result storage section 13e respectively depicted in FIG. 2. The CPU 140 reads test model data 160a, execution log data 160b, processing unit log data 160c, setting condition data 160d, and simulation result data 160e respectively from the data table 150a to the data table 150e, stores the data in the RAM 160, and executes processing on the basis of the data 160a to data 160e stored in the RAM 160.

The programs 130a to 130d need not be necessarily stored in the ROM 130 initially. For example, the programs may be stored in a "movable physical medium" such as a flexible disk (FD) which is inserted into the computer 110, a CD-ROM, a DVD disk, an optical magnetic disk, and an IC card, or in a "fixed physical medium" such as an HDD provided inside or outside the computer 110, or further in "another computer (or server)" or the like connected to the computer 110 via a public line, the Internet, a LAN, a WAN, and the like, and the computer 110 may read the programs from the above described storage media and execute the programs.

According to the embodiments, the operation of the test target device can be simulated in a short time without using complex processing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A simulation method comprising:
obtaining, using a processor, a command history of an executed process, the command history being generated while a predetermined processing including a plurality of events is executed in a test model program in which a function of a test target device is described in a software language;
extracting, using the processor, a processing unit log from among the obtained command history, the processing unit log being a part of the obtained command history and corresponding to one of the plurality of events; and
simulating, using the processor, an operation based on a user setting condition by executing a processing corresponding to the extracted processing unit log in the test model program in which communication speed of the test target device when the test target device is a communication device, an execution cycle of each of the plurality of events, a communication rate of a bus in the test model program when the test target device has the bus or a time spent for performing a line fetch in the test model program when the test target device is capable of performing the line fetch or any combination thereof is modified, wherein:
the test target device includes a storage section that stores a command statement for executing command processing corresponding to a predetermined command and a predetermined data on which read/write processing is executed,
the simulating includes determining whether the processing corresponding to the extracted processing unit log is the command processing or the read/write processing, and when the processing corresponding to the extracted processing unit log is the command processing, reading the command statement from the storage section and executing the command processing, and further when the processing corresponding to the extracted processing unit log is the read/write processing, executing processing for writing the predetermined data to the storage section or processing for reading the predetermined data stored in the storage section,
the storage section includes a first storage section and a second storage section that are used to execute the read/write processing,
the simulating includes, when executing the read/write processing, determining whether the read/write processing is processing for reading the predetermined data from a storage section or processing for writing the predetermined data to a storage section, and when the read/write processing is determined to be the processing for reading the predetermined data, determining whether the predetermined data is stored in the first storage section or the second storage section by checking the first storage section first, and reading the predetermined data, and further when the read/write processing is determined to be the processing for writing the predetermined data, determining whether the predetermined data is to be written to the first storage section or the second storage section by checking the first storage section first, and writing the predetermined data, and
the simulating includes, when repeatedly executing the processing for reading the predetermined data, forcibly reading the predetermined data from the second storage section without reading the predetermined data from the first storage section even if the predetermined data is stored in the first storage section.

2. The simulation method according to 1, wherein
the simulating includes determining, when executing the command processing, whether or not the command statement is stored in the first storage section, and when the command statement is determined to be stored in the first storage section, reading the command statement from the first storage section, and further when the command statement is determined not to be stored in the first storage section, reading the command statement from the second storage section.

3. The simulation method according to claim 1, wherein
the extracting includes extracting a start log from among a plurality of processing unit logs and the number of the plurality of processing unit logs, and
the simulating includes executing the processing corresponding to the extracted processing unit log by using the extracted start log and the extracted number.

4. A computer readable non-transitory storage medium having stored therein a simulation program, which causes a computer to execute a process comprising:
obtaining a command history of an executed process, the command history being generated while a predetermined processing including a plurality of events is executed in a test model program in which a function of a test target device is described in a software language;
extracting a processing unit log from among the obtained command history, the processing unit log being a part of the obtained command history and corresponding to one of the plurality of events; and,
simulating an operation based on a user setting condition by executing a processing corresponding to the extracted processing unit log in the test model program in which communication speed of the test target device when the test target device is a communication device, an execution cycle of each of the plurality of events, a communication rate of a bus in the test model program when the test target device has the bus or a time spent for performing a line fetch in the test model program when the test target device is capable of performing the line fetch or any combination thereof is modified, wherein:
the test target device includes a storage section that stores a command statement for executing command processing corresponding to a predetermined command and a predetermined data on which read/write processing is executed, the simulating includes determining whether the processing corresponding to the extracted processing unit log is the command processing or the read/write processing, and when the processing corresponding to the extracted processing unit log is the command processing, reading the command statement from the storage section and executing the command processing, and further when the processing corresponding to the extracted processing unit log is the read/write processing, executing processing for writing the predetermined data to the storage section or processing for reading the predetermined data stored in the storage section, the storage section includes a first storage section and a second storage section that are used to execute the read/write processing, the simulating includes, when executing the read/write processing, determining whether the read/write processing is processing for reading the predetermined data from a storage section or processing for writing the predetermined data to a storage section, and when the read/write processing is determined to be the processing for reading the predetermined data, determining whether the predetermined data is stored in the first storage section or the second storage section by checking the first storage section first, and reading the predetermined data, and further when the read/write processing is determined to be the processing for writing the predetermined data, determining whether the predetermined data is to be written to the first storage section or the second storage section by checking the first storage section first, and writing the predetermined data, and the simulating includes, when repeatedly executing the processing for reading the predetermined data, forcibly reading the predetermined data from the second storage section without reading the predetermined data from the first storage section even if the predetermined data is stored in the first storage section.

5. A simulation apparatus comprising:

a memory; and a processor coupled to the memory, wherein the processor executes a process comprising:

obtaining a command history of an executed process, the command history being generated while a predetermined processing including a plurality of events is executed in a test model program in which a function of a test target device is described in a software language;

extracting a processing unit log from among the obtained command history, the processing unit log being a part of the obtained command history and corresponding to one of the plurality of events; and, simulating an operation based on a user setting condition by executing a processing corresponding to the extracted processing unit log in the test model program in which communication speed of the test target device when the test target device is a communication device, an execution cycle of each of the plurality of events, a communication rate of a bus in the test model program when the test target device has the bus or a time spent for performing a line fetch in the test model program when the test target device is capable of performing the line fetch or any combination thereof is modified, wherein:

the test target device includes a storage section that stores a command statement for executing command processing corresponding to a predetermined command and a predetermined data on which read/write processing is executed, the simulating includes determining whether the processing corresponding to the extracted processing unit log is the command processing or the read/write processing, and when the processing corresponding to the extracted processing unit log is the command processing, reading the command statement from the storage section and executing the command processing, and further when the processing corresponding to the extracted processing unit log is the read/write processing, executing processing for writing the predetermined data to the storage section or processing for reading the predetermined data stored in the storage section, the storage section includes a first storage section and a second storage section that are used to execute the read/write processing, the simulating includes, when executing the read/write processing, determining whether the read/write processing is processing for reading the predetermined data from a storage section or processing for writing the predetermined data to a storage section, and when the read/write processing is determined to be the processing for reading the predetermined data, determining whether the predetermined data is stored in the first storage section or the second storage section by checking the first storage section first, and reading the predetermined data, and further when the read/write processing is determined to be the processing for writing the predetermined data, determining whether the predetermined data is to be written to the first storage section or the second storage section by checking the first storage section first, and writing the predetermined data, and the simulating includes, when repeatedly executing the processing for reading the predetermined data, forcibly reading the predetermined data from the second storage section without reading the predetermined data from the first storage section even if the predetermined data is stored in the first storage section.

* * * * *

UNITED STATES PATENT AND TRADEMARK OFFICE
CERTIFICATE OF CORRECTION

PATENT NO. : 8,428,927 B2
APPLICATION NO. : 12/662367
DATED : April 23, 2013
INVENTOR(S) : Noriyasu Nakayama et al.

Page 1 of 1

It is certified that error appears in the above-identified patent and that said Letters Patent is hereby corrected as shown below:

On the Title Page, Column 1 (Related to U.S. Application Data), Line 1-2, Delete "PCT/CT2007/070071" and insert -- PCT/JP2007/070071 --, therefor.

In the Claims

Column 20, Line 23, In Claim 2, delete "to 1" and insert -- to claim 1 --, therefor.

Signed and Sealed this
Sixth Day of August, 2013

Teresa Stanek Rea
*Acting Director of the United States Patent and Trademark Office*